(12) United States Patent
Ono et al.

(10) Patent No.: US 7,759,733 B2
(45) Date of Patent: Jul. 20, 2010

(54) POWER SEMICONDUCTOR DEVICE AND METHOD FOR PRODUCING THE SAME

(75) Inventors: Syotaro Ono, Kanagawa-ken (JP); Wataru Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 244 days.

(21) Appl. No.: 12/055,585

(22) Filed: Mar. 26, 2008

(65) Prior Publication Data

US 2008/0246084 A1 Oct. 9, 2008

(30) Foreign Application Priority Data

Apr. 5, 2007 (JP) ............................. 2007-099716

(51) Int. Cl.
*H01L 29/76* (2006.01)
(52) U.S. Cl. ..................... 257/341; 257/287; 257/339; 257/342; 257/401; 257/E21.418; 257/E29.257
(58) Field of Classification Search ................. 257/287, 257/339, 341, 342, 401, E21.418, E29.257
See application file for complete search history.

(56) References Cited

U.S. PATENT DOCUMENTS

| 6,683,347 | B1 | 1/2004 | Fujihira | |
| 6,888,195 | B2 * | 5/2005 | Saito et al. | .................. 257/328 |
| 6,930,352 | B2 | 8/2005 | Saito et al. | |
| 7,049,658 | B2 | 5/2006 | Saito et al. | |
| 7,576,393 | B2 * | 8/2009 | Ono et al. | .................. 257/341 |
| 2002/0185705 | A1 * | 12/2002 | Saitoh et al. | ................ 257/492 |

FOREIGN PATENT DOCUMENTS

| JP | 2000-40822 | 2/2000 |
| JP | 2003-101022 | 4/2003 |
| JP | 2003-258252 | 9/2003 |

OTHER PUBLICATIONS

Tatsuhiko Fujihira, et al., "Theory of Semiconductor Superjunction Devices" Jpn. J. Appl. Phys., vol. 36, Part 1, No. 10, Oct. 1997, pp. 6254-6262.

Wataru Saito, "Semisuperjunction MOSFETs: New Design Concept for Lower On-Resistance and Softer Reverse-Recovery Body Diode", IEEE Transactions on Electron Devices, vol. 50, No. 8, Aug. 2003, 1801-1806.

* cited by examiner

*Primary Examiner*—Andy Huynh
(74) *Attorney, Agent, or Firm*—Oblon, Spivak, McClelland, Maier & Neustadt, L.L.P.

(57) ABSTRACT

A power semiconductor device includes: a first semiconductor substrate; a second semiconductor layer; a plurality of third semiconductor pillar regions and a plurality of fourth semiconductor pillar regions that are provided in an upper layer of the second semiconductor layer and alternatively arranged along a direction parallel to an upper surface of the first semiconductor substrate; a first main electrode; and a second main electrode. A concentration of first-conductivity-type impurity in a connective portion between the second semiconductor layer and the third semiconductor pillar regions is lower than concentrations of first-conductivity-type impurity in portions of both sides of the connective portion in a direction from the second semiconductor layer to the third semiconductor pillar regions.

7 Claims, 8 Drawing Sheets

POWER SEMICONDUCTOR DEVICE AND METHOD FOR PRODUCING THE SAME

CROSS-REFERENCE TO RELATED APPLICATIONS

This application is based upon and claims the benefit of priority from the prior Japanese Patent Application No. 2007-099716, filed on Apr. 5, 2007; the entire contents of which are incorporated herein by reference.

BACKGROUND OF THE INVENTION

1. Field of the Invention

This invention relates to a power semiconductor device and a method for producing the same, and particularly to a vertical power semiconductor device having a super-junction structure and a method for producing the same.

2. Background Art

Power semiconductor devices such as MOSFET (metal-oxide-semiconductor field effect transistor) and IGBT (Insulated Gate Bipolar Transistor) have high-speed switching characteristics and reverse blocking voltage of some tens to some hundreds of V (hereinafter, referred to as breakdown voltage). Therefore, the power semiconductor devices are widely used for conversion, control, and so forth of the power in instruments such as, home appliances, communication devices and control devices of an in-vehicle motor. For achieving downsizing, efficiency enhancement, and power consumption reduction in these instruments, resistance in an ON state of the power semiconductor device (hereinafter, referred to as ON resistance) is required to be reduced. That is, in power semiconductor devices such as MOSFET or IGBT, it is strongly required that the ON resistance is reduced while keeping the high breakdown voltage.

In general, in the power semiconductor device, a drift layer through which current is flowed in the ON state. When high voltage is applied thereto in an OFF state, the drift layer is depleted to hold the voltage. Therefore, for improving the breakdown voltage, it is effective that the drift layer is thick and has a low concentration. On the other hand, in a semiconductor device, a channel is formed in an ON state and current flows through the drift layer. Therefore, for reducing the ON resistance, it is effective that the drift layer is thin and has a high concentration. Thus there is a tradeoff relation between the breakdown voltage and the ON resistance. In general, the ON resistance is proportion to 2.4 to 2.7 power of the breakdown voltage. That is, when the breakdown voltage is enhanced, the ON resistance also becomes high. There is a theoretical limit determined by characteristics of the semiconductor material (such as silicon) for satisfying both of the breakdown voltage and the ON resistance.

As a structure for realizing characteristics exceeding the theoretical limit of the semiconductor material, the super-junction (hereinafter, also referred to as SJ structure) has been proposed, a structure with p-type pillar layers and n-type pillar layers buried in the drift layer is known as a super-junction structure (see, for example, Fujihira et. al., "Theory of Semiconductor Superjunction Devices" Jpn. J. Appl. Phys. Vol. 36 (1997) pp. 6254-6262). In a semiconductor device before emergence of the SJ structure, the drift layer has been formed by a simple n-type layer. By contrast, in the SJ structure, the drift layer is formed by n-type pillar regions and the p-type pillar layers having high concentrations and a high aspect ratio that are alternatively arranged along the direction orthogonal to the direction to which the current flows. In the SJ structure, in the OFF state, high voltage is applied between the n-type pillar region and the p-type pillar region and each of the pillar regions is depleted, and thereby, high breakdown voltage is realized. On the other hand, in the ON state, the impurity concentration of the n-type pillar regions, which are current passages, is high, and therefore, low ON resistance is realized.

The present inventors have developed and disclosed a technique by which in such a power semiconductor device having the SJ structure, an n-type buffer layer having a lower concentration than that of the n-type pillar region is provided between the drain electrode and the SJ structure to improve the reverse recovery characteristics of the internal diode and to improve the balance between the breakdown voltage and the ON resistance (see, for example, JP-A 2003-101022 (Kokai)). Moreover, as a method for forming such a semiconductor device, the present inventors have developed and disclosed a method including, growing an n-type epitaxial layer on an n-type semiconductor substrate, selectively ion-implanting n-type impurity and p-type impurity to the n-type epitaxial layer, then repeating epitaxial growth and ion implantation, finally performing thermal diffusion treatment to connect the n-type diffusion regions and the p-type diffusion regions respectively between the epitaxial layers, and thereby forming n-type pillar regions and p-type pillar regions having a high aspect ratio (see, FIG. 4 of JP-A 2003-258252 (Kokai) and W. Saito, et al, "Semi super junction MOSFETs: New Design Concept for Lower On-Resistance and Softer Reverse-Recovery Body Diode", IEEE Trans Electron Devices, Vol. 50, No. 8, August 2003, pp. 1801-1806).

As described above, when the power semiconductor device in which the n-type buffer layer and the SJ structure are serially connected, more preferable reverse recovery characteristics of internal diode can be realized and the high balance of breakdown voltage/ON resistance can be realized, compared to a power semiconductor device in which the SJ structure is independently formed. However, in recent years, in the power semiconductor device, further breakdown voltage enhancement and ON resistance reduction has been required.

SUMMARY OF THE INVENTION

According to an aspect of the invention, there is provided a power semiconductor device, including: a first semiconductor substrate of a first conductivity type; a second semiconductor layer of the first conductivity provided on the first semiconductor substrate; a plurality of third semiconductor pillar regions of the first conductivity type and a plurality of fourth semiconductor pillar regions of a second conductivity type that are provided in an upper layer of the second semiconductor layer and alternatively arranged along a direction parallel to an upper surface of the first semiconductor substrate; a first main electrode provided on a lower surface of the first semiconductor substrate and connected to the first semiconductor substrate; and a second main electrode provided on the fourth semiconductor pillar regions, a concentration of first-conductivity-type impurity in a connective portion between the second semiconductor layer and the third semiconductor pillar regions being lower than concentrations of first-conductivity-type impurity in portions of both sides of the connective portion in a direction from the second semiconductor layer to the third semiconductor pillar regions.

According to another aspect of the invention, there is provided a power semiconductor device, including: a first semiconductor substrate of a first conductivity type; a second semiconductor layer of the first conductivity provided on the first semiconductor substrate; a plurality of third semiconductor pillar regions of the first conductivity type and a plurality of fourth semiconductor pillar regions of a second conductivity type that are provided in an upper layer of the second semiconductor layer and alternatively arranged along a direction parallel to an upper surface of the first semiconductor substrate; a first main electrode provided on a lower surface of the first semiconductor substrate and connected to the first semiconductor substrate; and a second main electrode provided on the fourth semiconductor pillar regions, a concentration profile of the first-conductivity-type impurity measured along a straight line passing through the first semiconductor substrate, the second semiconductor layer, and the third semiconductor pillar region in this order having a local minimum value in a position corresponding to a connective portion between the second semiconductor layer and the third semiconductor pillar regions.

According to another aspect of the invention, there is provided a method for producing a power semiconductor device, including: forming a second semiconductor layer of a first conductivity type on a first semiconductor substrate of the first conductivity type; forming a buffer layer having an impurity concentration lower than an impurity concentration of the second semiconductor layer; implanting first-conductivity-type impurity and second-conductivity-type impurity to a plurality of first regions and a plurality of second regions that are alternatively arranged in an upper plane of the buffer layer, respectively; forming an intermediate semiconductor layer having an impurity concentration lower than an impurity concentration of the second semiconductor layer, on the buffer layer; implanting first-conductivity-type impurity and second-conductivity-type impurity to the first regions and the second regions in an upper plane of the intermediate semiconductor layer, respectively; diffusing the implanted first-conductivity-type impurity and the second-conductivity-type impurity by performing heat treatment; forming a first main electrode connected to the first semiconductor substrate, on an lower surface of the first semiconductor substrate; and forming a second main electrode on the intermediate semiconductor layer.

DETAILED DESCRIPTION OF THE INVENTION

Hereinafter, the embodiment of this invention will be explained with reference to drawings.

Figure 1:
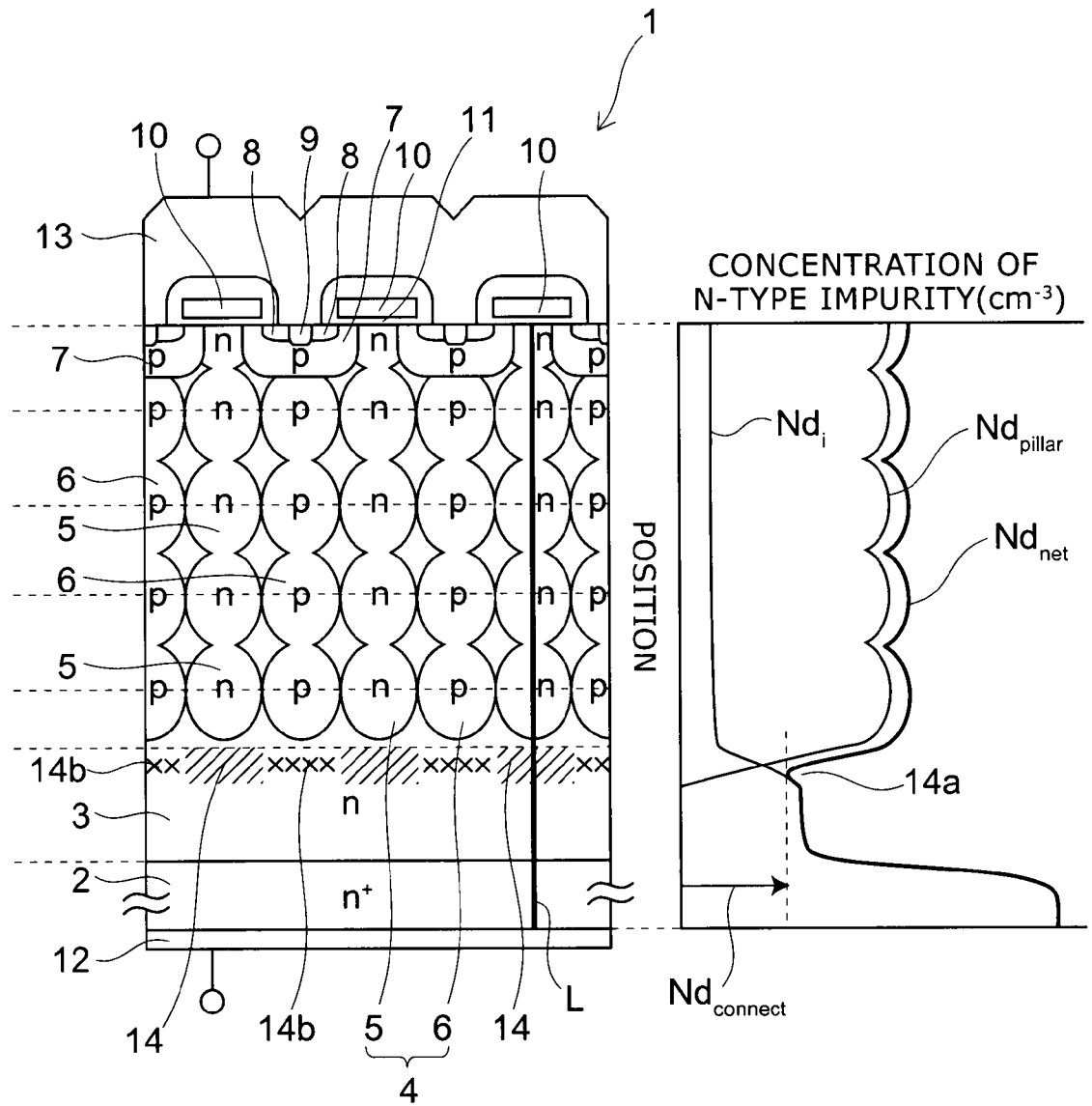
FIG. 1 is a cross-sectional view illustrating a power MOSFET according to the embodiment of this invention and a graphic view illustrating an impurity concentration profile.

FIG. 1 is a cross-sectional view illustrating a power MOSFET according to the embodiment of this invention and a graphic view illustrating an impurity concentration profile, in which the vertical axis is position in the longitudinal direction in this power MOSFET and the horizontal axis is n-type impurity concentration.

The longitudinal axis in the graphic view of FIG. 1 corresponds to position of points on the straight line L shown in the cross-sectional view, and the horizontal axis is a logarithmic axis.

As shown in FIG. 1, in a power MOSFET 1 serving as the power semiconductor device according to this embodiment, an $n^+$-type substrate 2 serving as a first semiconductor substrate is provided. N-type impurity is introduced into the $n^+$-type substrate 2 at a high concentration, and the conductivity type thereof is n type. The "n-type impurity" represents impurity acting as donor when introduced into a target semiconductor material and is, for example, phosphorus (P) with respect to silicon (Si), or the like. Moreover, the "p-type impurity" represents impurity acting as acceptor when introduced into a target semiconductor material and is, for example, boron (B) with respect to silicon. On the entire surface on the $n^+$-type substrate 2, an n-type buffer layer 3 serving as a second semiconductor layer is formed. The conductivity type of the n-type buffer layer 3 is n type, and the concentration of the n-type impurity is lower than the concentration of the n-type impurity in the $n^+$-type substrate 2. Moreover, in the n-type buffer layer 3 and the $N^+$-type substrate 2, p-type impurity is not substantially contained. Accordingly, the effective impurity concentration of the n-type buffer layer 3 is lower than the effective impurity concentration of the $N^+$-type substrate 2.

On the n-type buffer layer 3, a super-junction structure (SJ structure) 4 is formed. In the SJ structure 4, n-type pillar regions 5 of n type serving as third semiconductor pillar regions and p-type pillar regions 6 of p type serving as fourth semiconductor pillar regions are alternatively arranged along the direction parallel to an upper surface of the $N^+$-type substrate 2 (hereinafter, also referred to as lateral direction). The n-type pillar regions 5 and p-type pillar regions 6 extend over the entire thickness of the SJ structure 4 along the direction perpendicular to the upper surface of $N^+$-type substrate 2 (hereinafter, also referred to as longitudinal direction), and the shape thereof is, for example, a stripe form or a columnar shape. Moreover, the concentration of the n-type impurity in the n-type pillar regions 5 is higher than the concentration of n-type impurity in the n-type buffer layer 3, and the concentration of p-type impurity in the p-type pillar regions 6 is approximately equal to the concentration of n-type impurity in the n-type pillar regions 5. This is because in the SJ structure 4, when the impurity concentration of the p-type pillar region 6 and the impurity concentration of the n-type pillar region 5 are equal to each other, namely, when the charges are balanced, the highest breakdown voltage can be obtained, and, the ON resistance can be reduced by enhancing the concentration of n-type impurity of the n-type pillar region.

In FIG. 1, the lines representing the outer edges of the n-type pillar regions 5 and the p-type pillar regions 6 have a wave shape and are drawn so that gaps locally exist between the both pillar regions. However, the wave-shaped lines schematically represent equal-concentration lines of the n-type impurity and the p-type impurity, and actually, the n-type pillar region 5 and the p-type pillar region 6 are contacted in the entire region of the border plane thereof. As described later, the n-type pillar regions 5 and the p-type pillar regions 6 are formed by repeating plural times of epitaxial growth and ion implantation, for example, four times in the example shown in FIG. 1, and therefore, the equal concentration lines of the impurities become a wave shape. Moreover, in FIG. 1, the lines are drawn so that gaps exist between the upper edge of the n-type buffer layer 3 and (the lower edges of the n-type pillar regions 5 and the lower edges of the p-type pillar regions 6). However, the dashed line representing the upper edge of the n-type buffer layer 3 also merely schematically represents an equal-concentration line, and actually, the skirt of the impurity distribution forming the n-type buffer layer 3 and the skirts of the impurity distributions forming the n-type pillar regions 5 and the p-type pillar regions 6 respectively are superposed.

On each of the p-type pillar regions 6, a p-type base layer 7 of p type is provided and connected to the p-type pillar region 6. That is, a plurality of the p-type base layers 7 are provided, and an upper end of the n-type pillar region 5 lies between the contiguous p-type base layers 7. On an upper surface of each of the p-type base layers 7, two $n^+$-type source layers 8 are selectively formed, and the two $n^+$-type source layers 8 are separate in the lateral direction. Moreover, in the region between the $n^+$-type source layers 8 in each of the p-type base layers 7, a $p^+$-type region 9 is formed. The concentration of n-type impurity in the $n^+$-type source layers 8 and the concentration of p-type impurity in the $p^+$-type region 9 are higher than the concentration of p-type impurity in the p-type base layer 7.

Furthermore, in the immediately upper region of a region between the contiguous $n^+$-type source layers 8 formed in the contiguous p-type base layer 7, a gate electrode 10 is provided. That is, the gate electrode 10 is provided in the immediately upper region of one p-type base layer 7, the n-type pillar region 5, and the other p-type base layer 7 that are disposed between the contiguous $n^+$-type source layers 8. Accordingly, the gate electrode 10 is provided in the region including the immediately upper region of the portion of the p-type base layer 7 that lies between the $n^+$-type source layer 8 and the n-type pillar region 5. The upper surfaces of the n-type pillar region 5 and p-type base layer 7 compose the same plane, and on the plane, a gate insulating film 11 is provided. The gate insulating film 11 is disposed between the plane and the gate electrode 10 and insulates the gate electrode 10 from the above-described respective semiconductor layers and the semiconductor regions.

Moreover, on the lower surface of the $n^+$-type substrate 2, a drain electrode 12 serving as a first main electrode is provided and connected to the $n^+$-type substrate 2. On the other hand, above the n-type pillar region 5, p-type pillar region 6, and the p-type base layer 7, a source electrode 13 serving as a second main electrode is provided and connected to the $n^+$-type source layer 8 and the $p^+$-type region 9. The source electrode 13 is provided over the gate electrodes 10 but insulated from the gate electrodes 10.

In one example, the $n^+$-type substrate 2 is formed by single crystal silicon formed by a pulling method, and the n-type buffer layer 3, the n-type pillar regions 5, the p-type pillar regions 6, the p-base layers 7, the $n^+$-type source layers 8, and the $p^+$-type regions 9 are formed by subjecting ion implantation and thermal diffusion treatment to a single crystal silicon deposited by epitaxial growth. As the n-type impurity, phosphorus or antimony is introduced into the $n^+$-type substrate 2, the n-type buffer layer 3, the n-type pillar regions 5, the $n^+$-type source layers 8, and for example, antimony is introduced at an order of $10^{18}$ $cm^{-3}$. Moreover, the gate electrode 10 is formed by polycrystalline silicon. Furthermore, the gate insulating film 11 is formed by silicon oxide ($SiO_2$). Moreover, the drain electrode 12 and the source electrode 13 are formed by metal.

The concentration $Nd_{connect}$ of n-type impurity in a connective portion 14 between the n-type buffer layer 3 and the SJ structure 4, namely, between the n-type buffer layer 3 and (the n-type pillar regions 5 and the p-type pillar regions 6) is lower than the concentrations of n-type impurity in portions of both sides of the connective portion 14 in the direction from the n-type buffer layer 3 to the n-type pillar region 5 (longitudinal direction), for example, lower than the concentration of n-type impurity in the n-type buffer layer 3 and the concentration of n-type impurity in the n-type pillar region 5. That is to say, the concentration profile shown in the graphic view of FIG. 1, namely, the concentration profile of n-type impurity measured along the straight line L extending from the upper surface of the drain electrode 12 to the lower surface of the gate insulating film 11 and passing through the $n^+$-type substrate 2, the n-type buffer layer 3, and the n-type pillar region 5 in this order has a local minimum value. That is, this concentration profile is pitted in the position 14a. For example, this local minimum value is the minimum value in this concentration profile. The position of the connective portion 14 in the longitudinal direction corresponds to the position of the border portion 14b between the n-type buffer layer 3 and the p-type pillar region 6 in the longitudinal direction. That is, the position of the connective portion 14 in the longitudinal direction corresponds to the position in which the magnitude relation between the concentration of the n-type impurity and the concentration of the p-type impurity is switched when the concentration profile of n-type impurity and the concentration profile of p-type impurity are measured along a straight line (not shown) extending in the longitudinal direction and passing through the n-type buffer layer 3 and the p-type pillar layer 6. In FIG. 1, the regions corresponding to the connective portions 14 are shown by appending the diagonal lines thereto, and the regions corresponding to the border portions 14b are shown by the alignment of "X".

Next, the method for producing the power semiconductor device according to this embodiment composed as described above will be explained.

FIGS. 2A to 4B are process cross-sectional views exemplifying the method for producing a power MOSFET according to this embodiment.

Figure 2A:
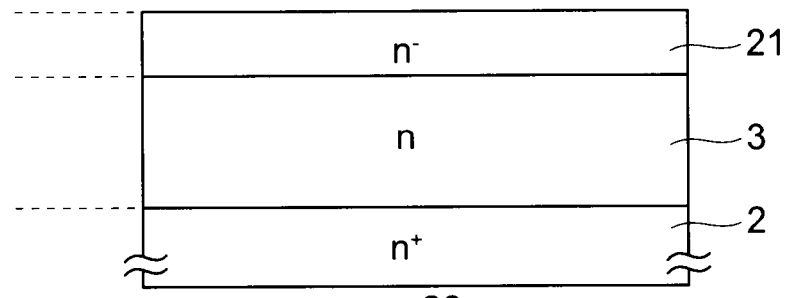
FIGS. 2A to 2D are process cross-sectional views exemplifying the method for producing a power MOSFET according to this embodiment.

First, as shown in FIG. 2A, the $n^+$-type substrate 2 made of, for example, single crystal silicon into which n-type impurity is implanted at a high concentration is prepared. Next, on the upper surface of the $n^+$-type substrate 2, the n-type buffer layer 3 made of, for example, silicon is epitaxially grown. The concentration of n-type impurity in the n-type buffer layer 3 is set to be lower than the concentration of n-type impurity in the $n^+$-type substrate 2.

Subsequently, on the n-type buffer layer 3, the $n^-$-type buffer layer 21 made of, for example, silicon is epitaxially grown. The concentration of n-type impurity in the $n^-$-type buffer layer 21 is set to be lower than the concentration of n-type impurity in the n-type buffer layer 3, for example, approximately hundredth lower. Accordingly, resistivity of the $n^-$-type buffer layer 21 is higher than the resistivity of the n-type buffer layer 3.

Moreover, when the diffusion length of impurity in the impurity diffusion step to be described later is w, it is preferable that a thickness of the n⁻-type buffer layer 21 is larger than the diffusion length w, and for example, set to be approximately the diffusion length w. The diffusion length w is the shortest distance between a position in which a concentration of n-type impurity implanted into the upper plane of the n⁻-type buffer layer 21 has a local maximum value and a position in which the concentration of n-type impurity is equal to the concentration of n-type impurity in the n-type buffer layer 3. And, the length w is the width of diffusion of the ion-implanted n-type impurity until the impurity comes to have the same concentration as the n-type buffer layer 3 independently from the n-type impurity originally contained in the ground. For example, in the graphic view of FIG. 1, the length w corresponds to the distance between the lowermost position at which the local maximum peak is located in the profile of the concentration $Nd_{pillar}$ of the implanted and thermally diffused n-type impurity and the position at which the value of the concentration $Nd_{pillar}$ becomes equal to the value corresponding to the n-type buffer layer 3 out of the profile of the concentration $Nd_i$ of the n-type impurity, which is originally contained in the ground.

Furthermore, for example, the n-type buffer layer 3 and the n⁻-type buffer layer 21 can be formed continuously in the same chamber. In this case, with continuously growing the silicon layer, the supply of the dopant gas containing the n-type impurity is reduced or stopped at a certain point. Alternatively, it is possible that after forming the n-type buffer layer 3 in a first chamber, the n⁺-type substrate 2 is transferred to a second chamber and the n⁻-type buffer layer 21 is formed in this chamber.

Figure 2B:
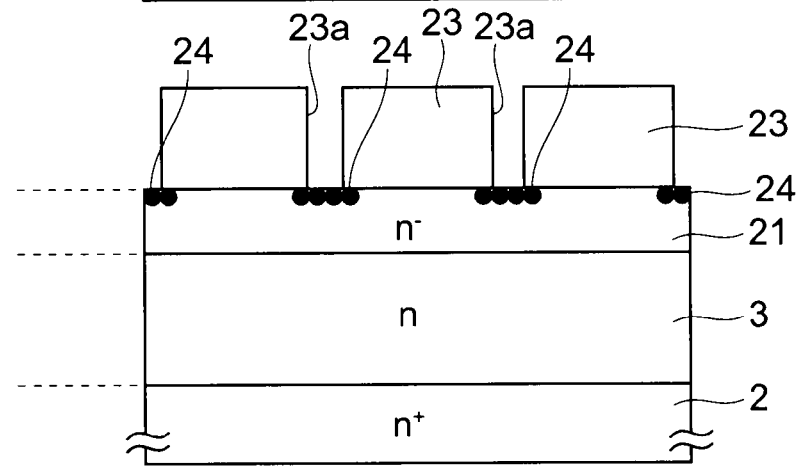

Next, as shown in FIG. 2B, a resist film 23 is formed on the n⁻-type buffer layer 21, and opening portions 23a are formed in the regions in which the p-type pillar regions 6 are to be formed (see, FIG. 1). By using the resist film 23 as the mask, the p-type impurity 24 such as boron (B) is ion-implanted into the upper plane of the n⁻-type buffer layer 21. Thereby, the p-type impurity 24 is locally introduced into a plurality of regions separate from each other in the upper layer portions of the n⁻-type buffer layer 21, namely, the regions in which the p-type pillar regions 6 are to be formed. In FIGS. 2A to 3B, the p-type impurity 24 is schematically represented by the black circles (●).

Figure 2C:
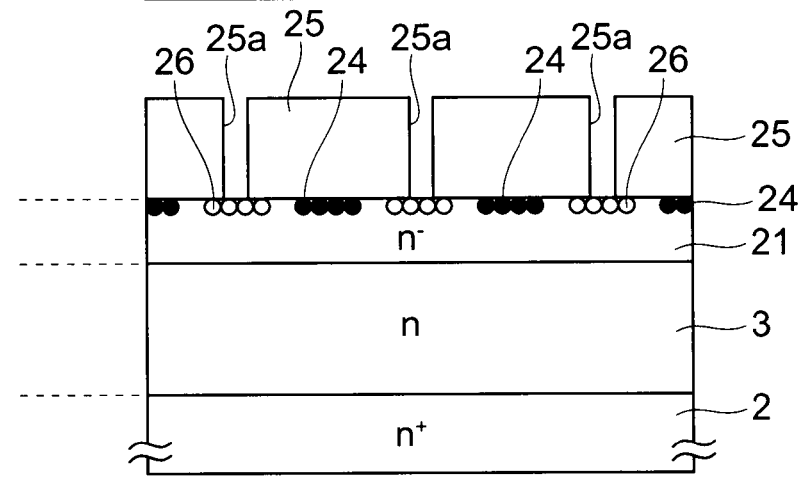

Next, as shown in FIG. 2C, the resist film 23 is removed and a new resist film 25 is formed on the n⁻-type buffer layer 21. Next, in the resist film 25, the opening portions 25a are formed in the regions in which the n-type pillar region 5 is to be formed. The opening portions 25a are formed so as to be alternatively arranged to the regions in which the opening portions 23a are formed in the step shown in FIG. 2B. By using the resist film 25 as the mask, the n-type impurity 26 such as phosphorus (P) is ion-implanted into the upper plane of the n⁻-type buffer layer 21. Thereby, the n-type impurity 26 is locally introduced into a plurality of regions separate from each other in the upper layer portions of the n⁻-type buffer layer 21, namely, the regions in which the n-type pillar regions 6 are to be formed. In FIGS. 2A to 3B, the n-type impurity 26 is schematically represented by the white circles (○).

Figure 2D:
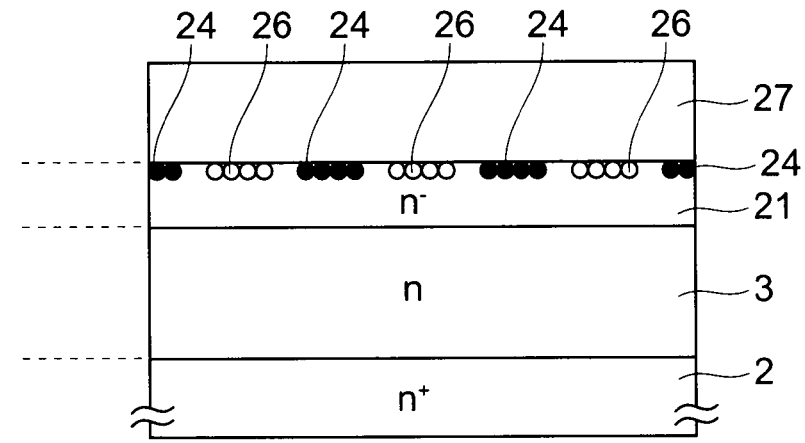

Next, as shown in FIG. 2D, the resist film 25 is removed. Next, on the n⁻-type buffer layer 21, the first epitaxial layer 27 is epitaxially grown as the intermediate semiconductor layer. It is preferable that the thickness of the epitaxial layer 27 is equal to or larger than the thickness of the n⁻-type buffer layer 21, for example, set to be approximately twice larger than the diffusion length w of the above-described impurity. Moreover, the conductivity type of the epitaxial layer 27 is, for example, n type, and the effective impurity concentration of the epitaxial layer 27 is set to be lower than the effective impurity concentration of the n-type buffer layer 3. However, the n⁻-type buffer layer 21 and the epitaxial layer 27 may be p type. Also, in this case, the effective impurity concentrations of the n⁻-type buffer layer 21 and the epitaxial layer 27 are set to be lower than the effective impurity concentration of the n-type buffer layer 3.

Next, by the same step as the above-described step, a barrier layer (not shown) is formed on the first epitaxial layer 27 and the p-type impurity and n-type impurity are selectively ion-implanted. Thereby, in the upper layer portion of the first epitaxial layer 27, the p-type impurity is introduced into the regions in which the p-type pillar regions 6 are to be formed, and the n-type impurity is introduced into the regions in which the n-type pillar regions 5 are to be formed.

Figure 3A:
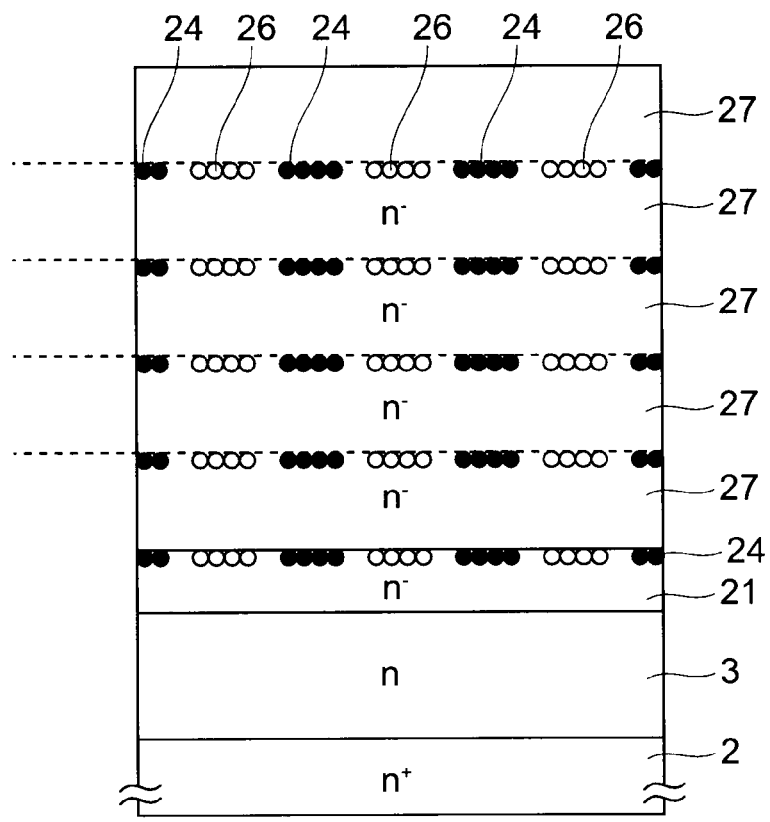
FIGS. 3A to 3B are process cross-sectional views exemplifying the method for producing a power MOSFET according to this embodiment.

Next, as shown in FIG. 3A, the above-described formation of an epitaxial layer and selective introduction of the impurities are repeated alternately more than once. Thereby, a plurality of epitaxial layers are further stacked above the first epitaxial layer 27, and the p-type impurity 24 and the n-type impurity 26 are locally introduced in the upper portions of each of the epitaxial layers 27. For example, in the example shown in FIG. 3A, a total of three epitaxial layers 27 are stacked above the n⁻-type buffer layer 21, and the p-type impurity 24 and the n-type impurity 26 are introduced in the upper portions of each of the epitaxial layers 27. Next, thereon, the uppermost epitaxial layer 27 is formed. In the steps shown in FIGS. 2D and 3A, the thickness of each of the epitaxial layers 27 is, for example, 2 w.

Figure 3B:
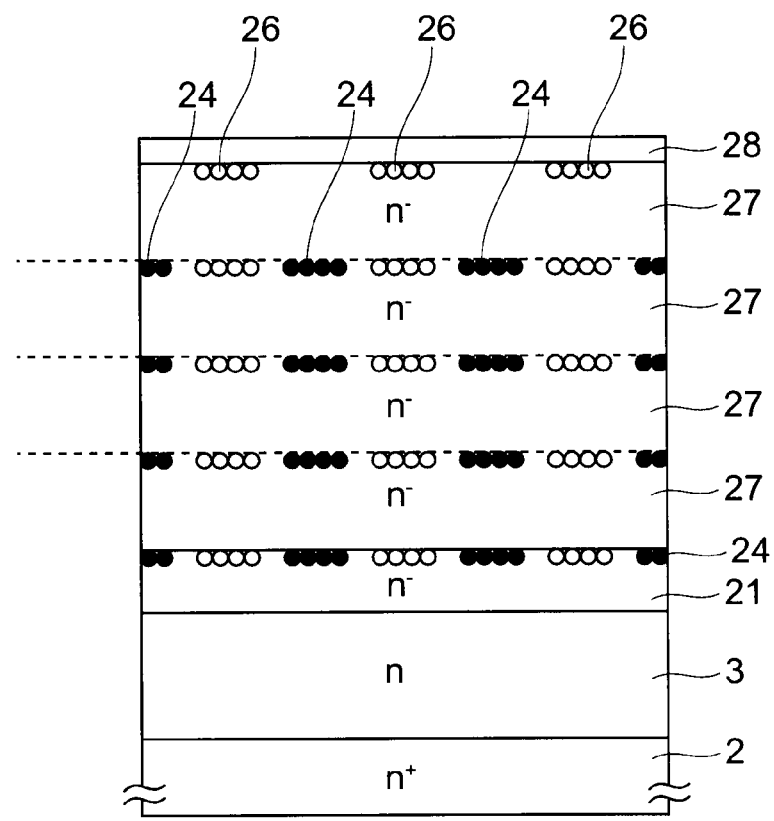

Next, as shown in FIG. 3B, on the uppermost epitaxial layer 27, for example, a barrier layer 28 made of, for example, silicon oxide is formed. Then, through this barrier layer 28, the n-type impurity 26 is introduced into the regions in which the n-type pillar regions 5 is to be formed in the upper layer portions of the uppermost epitaxial layer 27.

Figure 4A:
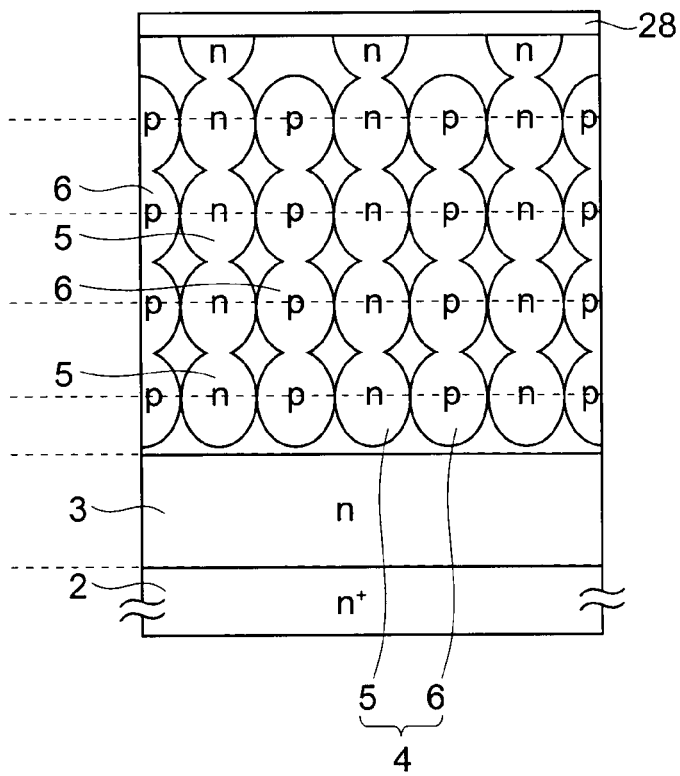
FIGS. 4A to 4B are process cross-sectional views exemplifying the method for producing a power MOSFET according to this embodiment.

Next, as shown in FIG. 4A, by performing heat treatment, the p-type impurity 24 and the n-type impurity 26 are thermally diffused. Thereby, each of the p-type impurities 24 and the n-type impurities 26 diffuses approximately isotropically in the longitudinal direction and in the horizontal direction, namely, spherically so that the region into which each of the impurities is introduced, namely, each region in the vicinity of the interface between the epitaxial layers 27 serves as the center. As a result, the diffusion regions of the p-type impurity 24 arranged on a line in the longitudinal direction are contacted with each other to be integrated, and thereby the p-type pillar region 6 extending in the longitudinal direction is formed. Moreover, the diffusion regions of the n-type impurity 26 arranged on a line in the longitudinal direction are contacted with each other to be integrated, and thereby the n-type pillar region 5 extending in the longitudinal direction is formed. And, the p-type pillar region 6 and the n-type pillar region 5 contiguous to each other are contacted to form a p-n junction plane. As a result, the SI structure 4 is composed. In this case, the connective portions 14 (see, FIG. 1) and the border portions 14b (see, FIG. 1) are formed. However, in FIGS. 4A and 4B, the illustration is omitted. Then, the barrier layer 28 is removed. The dashed lines shown in FIG. 4A correspond to the dashed lines shown in FIGS. 2A to 3B and represent the border plane of each of the layers before diffusing the impurities.

Figure 4B:
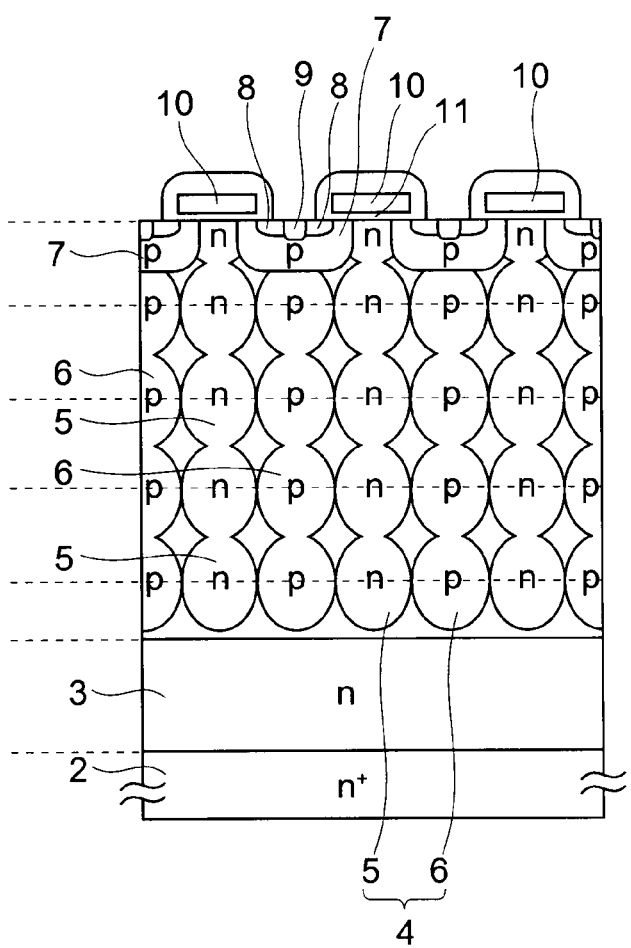

Next, as shown in FIG. 4B, the p-type impurity is introduced into the regions of the uppermost epitaxial layer 27 between the n-type pillar regions 5, namely, the immediately upper regions of the p-type pillar regions formed in the lower epitaxial layers 27, and thereby the p-type base layers 7 are formed. Next, on the upper plane of the p-type base layer 7, two n+-type source layers 8 are formed separately from each other, and the p+-type region 9 is formed in the region between the n+-type source layers 8. Then, the gate insulating film 11 is formed in the region on the uppermost epitaxial layer 27 including the immediately upper region of the n-type pillar region 5, and thereon, the gate electrode 10 is formed, and the gate electrode 10 is covered with an insulating film.

Next, as shown in FIG. 1, the drain electrode 12 is formed on the lower surface of the n+-type substrate 2. The drain electrode 12 is connected to the n+-type substrate 2. Next, on the uppermost epitaxial layer 27, the source electrode 13 is formed so as to cover the gate insulating film 11 and the gate electrode 10. The source electrode 13 is connected to the n+-type source layers 8 and the p+-type regions 9. Thereby, the power MOSFET 1 is produced.

Next, Comparative example of this embodiment will be explained.

Figure 5A:
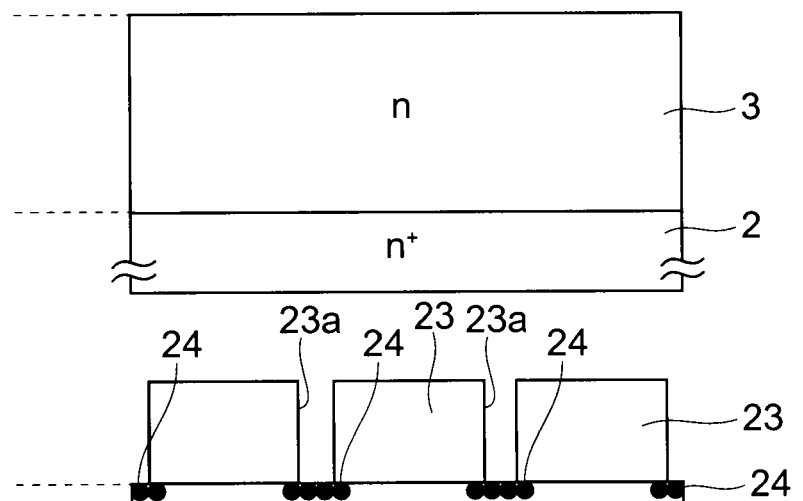
FIGS. 5A to 5D are process cross-sectional views exemplifying the method for producing a power MOSFET according to a comparative example of this embodiment.
Figure 5B:
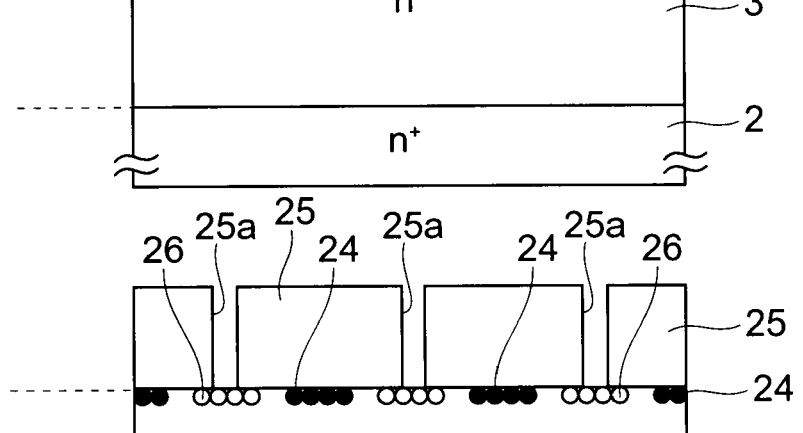
Figure 5C:
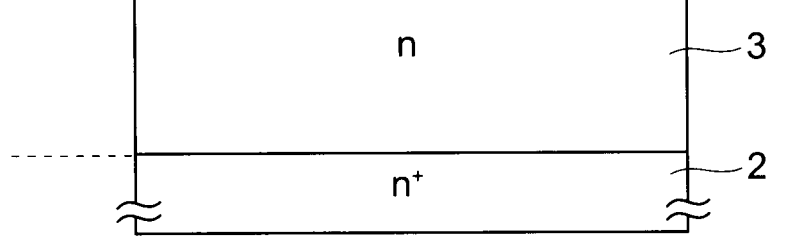
Figure 5D:
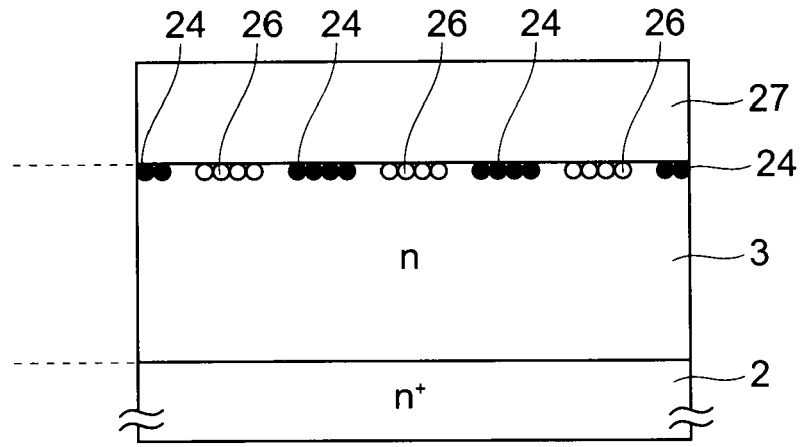
Figure 6:
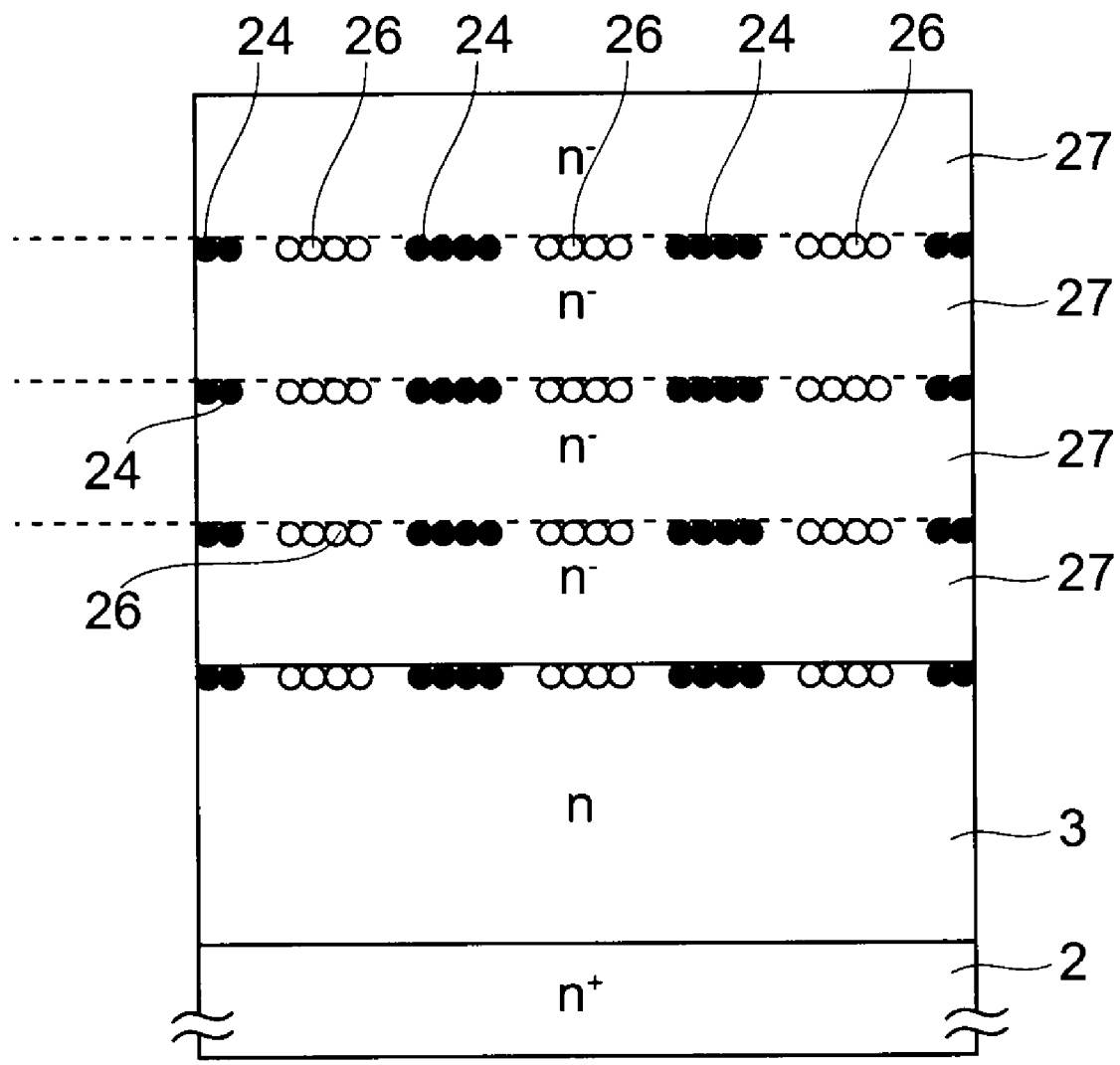
FIG. 6 is a process cross-sectional view exemplifying the method for producing a power MOSFET according to this comparative example.

FIGS. 5A to 6 are process cross-sectional views exemplifying the method for producing a power MOSFET according to this comparative example.

Figure 7:
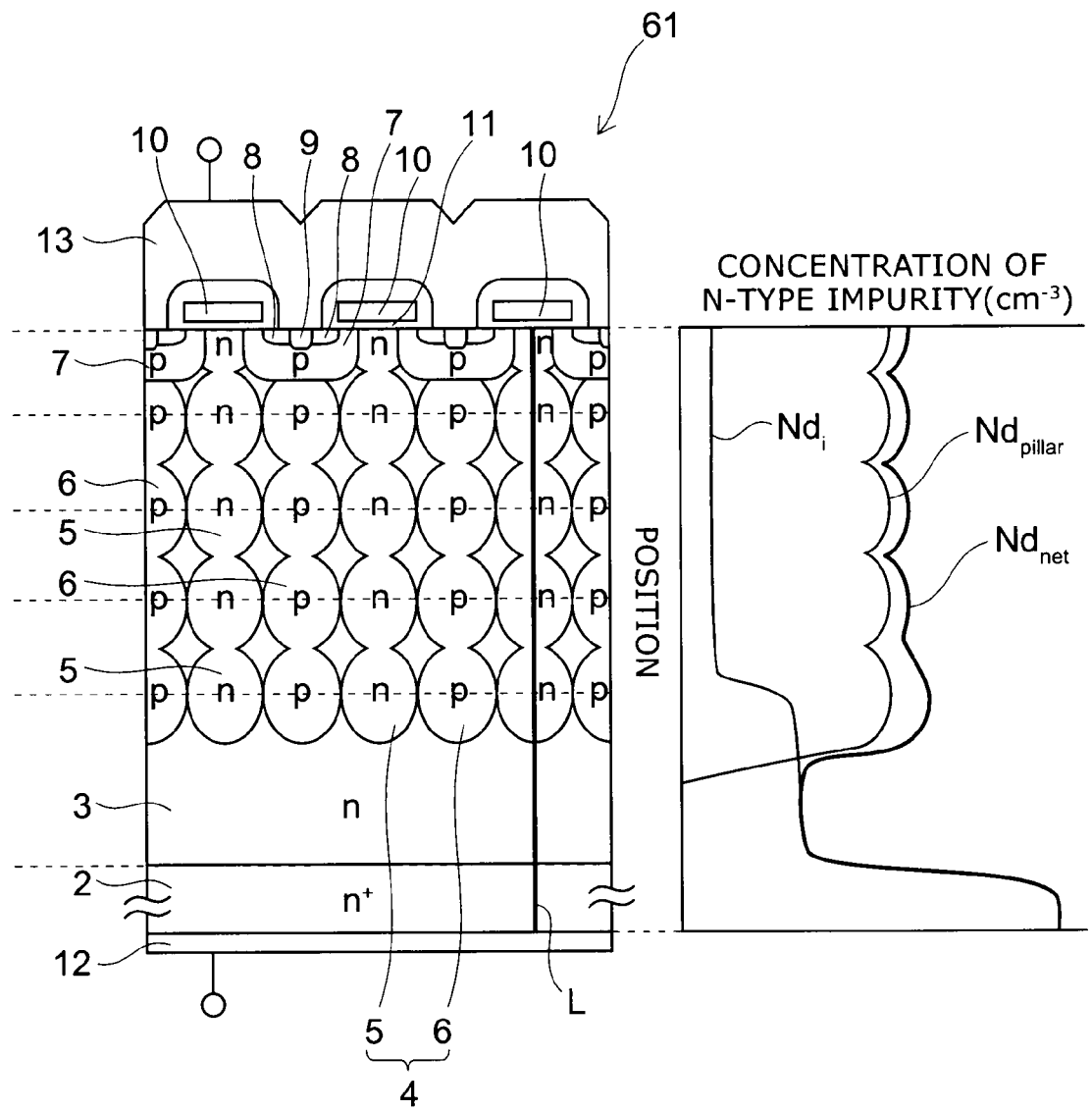
FIG. 7 is a cross-sectional view illustrating a power MOSFET according to this comparative example and a graphic view illustrating an impurity concentration profile.

FIG. 7 is a cross-sectional view illustrating a power MOSFET according to this comparative example and a graphic view illustrating an impurity concentration profile, in which the vertical axis is a position in the longitudinal direction in this power MOSFET and the horizontal axis is n-type impurity concentration.

The longitudinal axis in the graphic view of FIG. 7 corresponds to positions of points on the straight line L shown in the cross-sectional view, and the horizontal axis is a logarithmic axis.

In the method for producing a power MOSFET according to this comparative example is different from the producing method according to the above-described embodiment of this invention, in the point that the n−-type buffer layer 21 (see, FIG. 2A) is not formed. That is, as shown in FIG. 5A, after epitaxially growing the n-type buffer layer 3 on the n+-type substrate 2, the p-type impurity 24 is introduced into the upper layer portions of the n-type buffer layer 3 without forming the n−-type buffer layer 21 (see, FIG. 2A) as shown in FIG. 5B. Then, as shown in FIG. 5C, the n-type impurity 26 is introduced. And, as shown in FIG. 5D, the first epitaxial layer 27 is grown on the n-type buffer layer 3.

Next, as shown in FIG. 6, plural times, for example, three times of introduction of the impurities and formation of the epitaxial layers 27 are repeated. Next, by performing heat treatment, the p-type impurity 24 and the n-type impurity 26 are diffused to form the p-type pillar regions 6 and the n-type pillar regions 5. Next, as shown in FIG. 7, the gate insulating film 11, the gate electrode 10, the drain electrode 12, and the source electrode 13 are formed, and thereby, the power MOSFET 61 is produced. The producing method except for the above-described points according to this comparative example is the same as the above-described embodiment of this invention Next, the operation of the embodiment of this invention will be explained with being compared to the above-described comparative example.

In the above-described comparative example, the p-type impurity 24 and the n-type impurity 26 are introduced into the upper layer portions of the n-type buffer layer 3 in the step shown in FIG. 5B. Therefore, in the step shown in FIG. 7, when these impurities are thermally diffused to form the p-type pillar regions 6 and the n-type pillar regions 5, the lower ends of the p-type pillar regions 6 and the lower ends of the n-type pillar regions 5 come to invade the inside of the n-type buffer layer 3. This is also indicated by the following. In the graphic view of FIG. 7, the concentration of n-type impurity in the connective portion between the n-type buffer layer 3 and the n-type pillar layers 5 is not lower than the concentration of n-type impurity in the n-type buffer layer 3 and the n-type pillar regions 5, and the concentration of n-type impurity increases monotonically from the position corresponding to the n-type buffer layer 3 to the position corresponding to the n-type pillar region 5. As described above, the lower ends of the p-type pillar regions 6 and the n-type pillar regions 5 invade the inside of the n-type buffer layer 3, and thereby, the impurity concentration is displaced in these lower ends.

That is, as shown in the graphic view of FIG. 7, the concentration $Nd_i$ of n-type impurity in the ground before implanting the impurity has a step-like profile of being the highest in the n+-type substrate 2 and the second highest in the n-type buffer layer 3 and the lowest in the epitaxial layers 27. Moreover, the concentration $Nd_{pillar}$ of the ion-implanted and thermally diffused n-type impurity has a wave-shaped profile whose the central positions of the implantation have local maximum values, but the magnitudes of the respective local maximum values are approximately equal. The impurity concentration $Nd_{net}$ after the thermal diffusion treatment becomes the sum of the impurity concentration $Nd_i$ of the ground and the implanted-and-diffused-impurity concentration $Nd_{pillar}$. That is, $Nd_{net}=Nd_i+Nd_{pillar}$. Therefore, the impurity concentration $Nd_{net}$ in the portions except for the lower ends of the n-type pillar regions 5 becomes the sum of the impurity concentration of the epitaxial layers 27 and the implanted-and-diffused-impurity concentration. However, the impurity concentration $Nd_{net}$ in the lower ends of the n-type pillar regions 5 becomes the sum of the impurity concentration of the n-type buffer layer 3 and the implanted-and-diffused-impurity concentration. Accordingly, the impurity concentration in the lower ends of the n-type pillar regions 5 becomes higher than the impurity concentration of the portions except for the lower ends.

On the other hand, the implanted-and-diffused p-type impurity is reversed with the n-type impurity of the ground. In this case, the p-type impurity in the lower ends of the p-type pillar regions 6 is reversed with the n-type impurity having a relatively high concentration contained in the n-type buffer layer 3. However, the p-type impurity in the portions except for the lower ends is reversed with the n-type impurity having a relatively low concentration contained in the epitaxial layers 27. As a result, the effective concentration of the p-type impurity in the lower ends of the p-type pillar regions 6 becomes lower than the effective concentration of the p-type impurity in the portions except for the lower ends. By these effects, the lower end of the SJ structure 4 becomes in the n-rich state in which the n-type impurity concentration is higher than the p-type impurity concentration.

In the SJ structure, when the n-type impurity amount contained in the n-type pillar regions and the p-type impurity amount contained in the p-type pillar regions are equal to each other, the breakdown voltage becomes the highest. However, as described above, the lower portions of the SJ structure 4 become n-rich, and thereby unbalance of charges is caused and the breakdown voltage comes to lower. As a result, in the lower portions, the balance between the breakdown voltage and the ON resistance is degraded.

By contrast, in the embodiment of this invention, as shown in FIGS. 2A to 3B, the n−-type buffer layer 21 is formed on the n-type buffer layer 3, and initial implantation of the p-type impurity and n-type impurity is subjected to the upper plane of the n−-type buffer layer 21. Therefore, when these impurities are thermally diffused, the impurities are difficult to reach the n-type buffer layer 3. Thereby, the lower portions of the n-type pillar regions 5 and p-type pillar regions 6 do not invade the inside of the n-type buffer layer 3, and the n-type buffer layer 3 and the SJ structure 4 are separated spatially. Because the lower portions of the n-type pillar regions 5 and the p-type pillar regions 6 do not invade the inside of the n-type buffer layer 3 as described above, the impurity concentration of the lower portions thereof is less frequently affected by the n-type buffer layer 3, and the charge balance in the lower portions of the SJ structure 4 is not largely broken. Thereby, in the power MOSFET 1, high breakdown voltage can be obtained.

It is verifiable that the lower portions of the n-type pillar regions 5 do not invade the inside of the n-type buffer layer 3, for example, by measuring the concentration profile of n-type impurity along the straight line L. That is, if the lower portions of the n-type pillar regions 5 do not invade the inside of the n-type buffer layer 3, the concentration profile of n-type impurity has a local minimum value in the position 14a corresponding to the connective portion 14 between the n-type buffer layer 3 and the n-type pillar regions 5. Moreover, the n-type pillar regions 5 and the p-type pillar regions 6 can be formed in the approximately same position in the longitudinal direction, respectively. Therefore, if the lower portions of the n-type pillar regions 5 do not invade the inside of the n-type buffer layer 3, it can be said that the lower portions of the p-type pillar regions also invade the inside of the n-type buffer layer 3. The above-described concentration profile of n-type impurity can be measured by SSRM (Scanning Spread Resistance Microscopy) or SCM (Scanning Capacitance Microscopy).

By contrast, in the power MOSFET 61 according to the comparative example, the lower portions of the n-type pillar regions 5 and the p-type pillar regions 6 invade the inside of the n-type buffer layer 3. Therefore, as shown in FIG. 7, in the concentration profile of n-type impurity, such a local minimum value as described above cannot be recognized.

In this embodiment, as a thickness t of the n⁻-type buffer layer 21 is thicker, the effect of separating the n-type buffer layer 3 and the SJ structure 4 becomes high, and at the same time, the ON resistance increases. Therefore, the thickness t of the n⁻-type buffer layer 21 has a preferable range. When the thickness t of the n⁻-type buffer layer 21 is set to be equal to or larger than the diffusion length w of the impurity, the lower portions of the n-type pillar regions 5 and the p-type pillar regions 6 can be certainly prevented from invading the inside of the n-type buffer layer 3, and the above-described effect can be certainly obtained. On the other hand, if the thickness t of the n⁻-type buffer layer 21 exceeds 2 w, the effect of separating the n-type buffer layer 3 and the SJ structure 4 is saturated, but the ON resistance continuously increases. Accordingly, it is preferable that the thickness t of the n⁻-type buffer layer 21 is w to 2 w. Because the diffusion length w of the impurity is varied according to the variation of temperature in the thermal diffusion step, it is preferable that the thickness t of the n⁻-type buffer layer 21 is determined by seasoning the variation range of the diffusion length w.

Next, the effect of this embodiment will be explained.

The power MOSFET 1 according to this embodiment shown in FIG. 1 and the power MOSFET 61 according to the comparative example shown in FIG. 7 were actually produced, and the breakdown voltage and the ON resistance thereof were measured. In the production of these MOSFETs, the n⁻-type buffer layer 21 is formed in this embodiment, and is not in the comparative example. However, in the comparative example, the producing method and the size of each part except for this are set to the same as this embodiment.

Figure 8:
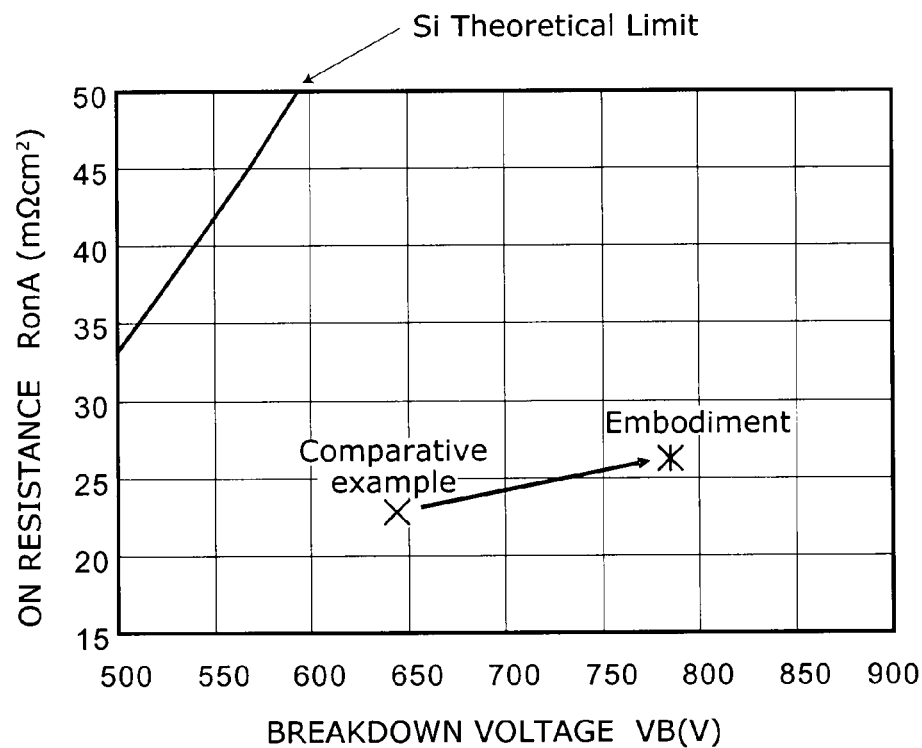
FIG. 8 is a graphic view exemplifying characteristics of the power MOSFETs according to this embodiment and the comparative example.

FIG. 8 is a graphic view exemplifying characteristics of the power MOSFETs according to this embodiment and the comparative example, in which the horizontal axis is breakdown voltage (VB) and the vertical axis is ON resistance (RonA).

The ON resistance RonA shown in the longitudinal axis of FIG. 8 is a product of resistance value Ron (mΩ) and effective area of device (cm²), and the unit thereof is mΩcm² (milliohm×centimeter×centimeter).

As shown in FIG. 8, in the power MOSFET 1 according to this embodiment, the ON resistance slightly increased but the breakdown voltage was largely improved and the total balance was better, compared to the power MOSFET 61 according to the comparative example. The reason why the ON resistance slightly increased in this embodiment is thought to be that the impurity concentration in the connective portion 14 is lower than the impurity concentration of the n-type buffer layer 3 and therefore the resistance of this portion increases. However, by adjusting the design of the portions except for the connective portion 14 in the power MOSFET 1, the balance between the breakdown voltage and the ON resistance is discretionally controlled to be capable of improving the breakdown voltage with ensuring the same value as the power MOSFET 61 according to the comparative example.

Moreover, a plurality of power MOSFETs having the different impurity concentrations of the connective portion 14 were produced, and the breakdown voltage and the ON resistance of these power MOSFETs were measured and the effects of the concentration of the connective portion on the characteristics of the power MOSFET were evaluated.

Figure 9:
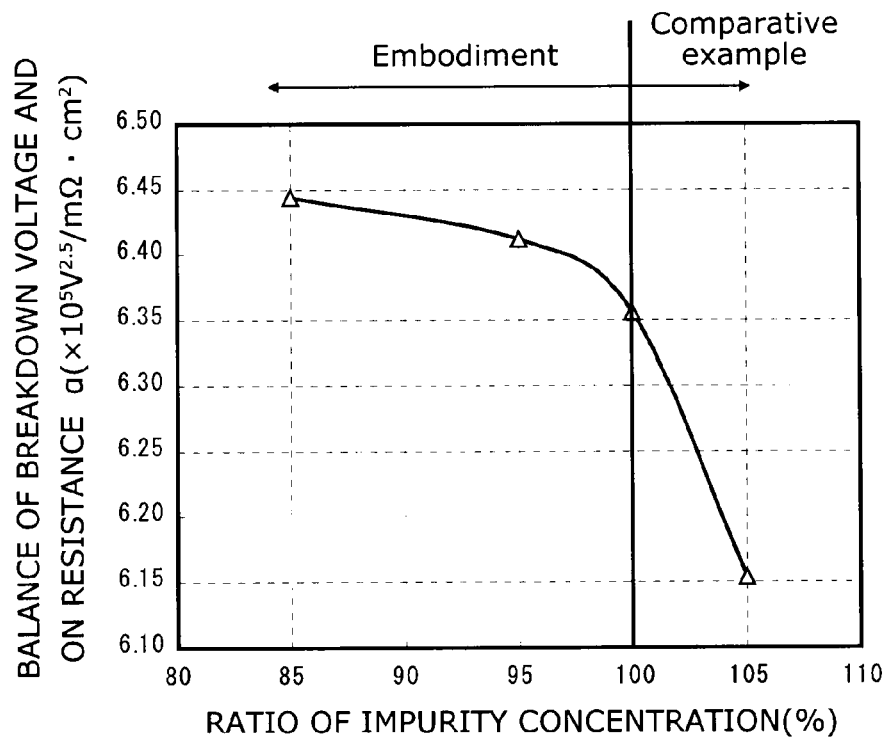
FIG. 9 is a graphic view exemplifying the effect of the concentration of the connective portion on the characteristics of the power MOSFET.

FIG. 9 is a graphic view exemplifying the effect of the concentration of the connective portion on the characteristics of the power MOSFET, in which the horizontal axis is a ratio of the n-type impurity concentration of the connective portion 14 with respect to the n-type impurity concentration of the n-type buffer layer 3 (hereinafter, simply referred to as "ratio of impurity concentration") and the vertical axis is the balance between the breakdown voltage and the ON resistance.

The index α represented by the longitudinal axis of FIG. 9 is provided by the following mathematic formula 1, in which the ON resistance of the device is RonA (mΩcm²) and the breakdown voltage is VB (V). From the following mathematical formula 1, as the breakdown voltage of the device is higher and the ON resistance thereof is lower, the value α is larger. Accordingly, as the value α is larger, the characteristics of the device are more excellent. The unit of the index α is $\{V^{2.5}/(m\Omega \times cm^2)\}$.

$$\alpha = VB^{2.5}/RonA \qquad \text{Mathematical Formula 1}$$

As described above, in the power MOSFET 1 according to this embodiment, the n-type impurity concentration of the connective portion 14 is lower than the n-type impurity concentration of the n-type buffer layer 3, and therefore, the ratio of the impurity concentrations is less than 10%. And, as shown in FIG. 9, when the ratio of the impurity concentrations is less than 100%, the index α becomes high and stabilized. By contrast, in the power MOSFET 61 according to the comparative example, the ratio of impurity concentration becomes 100% or more. And as shown in FIG. 9, when the ratio of the impurity concentrations is 100% or more, the index α is low and unstable. Accordingly, the balance between the breakdown voltage and the ON resistance of the power MOSFET 1 according to this embodiment is more excellent than the balance of the power MOSFET 61 according to the comparative example.

As described above, according to this embodiment, the power semiconductor devices having high breakdown voltage and low ON resistance can be stably produced.

The power MOSFET 1 according to this embodiment can be suitably used as, for example, vertical semiconductor devices of middle or high breakdown voltage applied to the power electronics field such as various switching powers.

As described above, the embodiment of this invention has been explained but this invention is not limited to this embodiment. For example, the above-described embodiment to which addition, deletion, or design change of a component, or addition, deletion, or condition change of a step is subjected appropriately by a skilled person are included in the scope of this invention as long as having the essentials of this invention.

For example, in each of the above-described embodiment, the description is performed by setting the first conductivity type to be n type and the second conductivity type to be p type. However, this invention can also be carried out so that the first conductivity type is set to be p type and that the second conductivity type is n type. Moreover, in the above-described embodiment, the example in which the impurity concentrations of the n-type pillar regions 5 and p-type pillar regions 6 are macroscopically uniform has been shown. However, this invention is not limited thereto but the impurity concentrations may be inclined along the longitudinal direction. For example, the impurity concentration of the source electrode side may be lower than the impurity concentration in the central portion in the longitudinal direction. Thereby, the breakdown in the interface between the p-type base layer 7 and the n-type pillar region 5 can be effectively suppressed, and the total breakdown voltage can be enhanced.

Furthermore, in the above-described embodiment, the device having a planar-type MOS gate structure has been exemplified and explained but the power semiconductor device according to this invention can also be carried out by using a trench-type MOS gate structure. Furthermore, in the above-described embodiment, only the structure of the cell portion has been explained but the device edge termination structure is also not particularly limited, and various structures such as guard-ring structure, RESURF (reduced surface field) structure, or field plate structure can be carried out.

Moreover, in the above-described embodiment, the example in which the n-type impurity is phosphorous and the p-type impurity is boron is shown, but this invention is not limited thereto. Moreover, in the above-described embodiment, the MOSFET in which silicon (Si) is used as the semiconductor has been explained. However, as the semiconductor, a compound semiconductor such as silicon carbide (SiC) or gallium nitride (GaN) or a wide band gap semiconductor such as diamond can also be used.

Moreover, in the above-described embodiment, the examples in which the power semiconductor device is MOSFET having a super-junction structure. However, this invention is not limited thereto, but the power semiconductor device may be a device such as, a mixed device of MOSFET and SBD (Schottky Barrier Diode), or an IGBT (Insulated Gate Bipolar Transistor).

The invention claimed is:

1. A power semiconductor device, comprising:
   a first semiconductor substrate of a first conductivity type;
   a second semiconductor layer of the first conductivity provided on the first semiconductor substrate;
   a plurality of third semiconductor pillar regions of the first conductivity type and a plurality of fourth semiconductor pillar regions of a second conductivity type that are provided in an upper layer of the second semiconductor layer and alternatively arranged along a direction parallel to an upper surface of the first semiconductor substrate;
   a first main electrode provided on a lower surface of the first semiconductor substrate and connected to the first semiconductor substrate; and
   a second main electrode provided on the fourth semiconductor pillar regions,
   a concentration of first-conductivity-type impurity in a connective portion between the second semiconductor layer and the third semiconductor pillar regions being lower than concentrations of first-conductivity-type impurity in portions of both sides of the connective portion in a direction from the second semiconductor layer to the third semiconductor pillar regions,
   a position of the connective portion in a direction perpendicular to an upper surface of the first semiconductor substrate corresponding to a position of a border between the second semiconductor layer and the fourth semiconductor pillar regions in the perpendicular direction,
   a concentration profile of the first-conductivity-type impurity measured along a straight line passing through the first semiconductor substrate, the second semiconductor layer, and the third semiconductor pillar region in this order having a local minimum value in a position corresponding to the connective portion, and
   the local minimum value being greater than the concentration of the first-conductive-type impurity in the fourth semiconductor pillar region and smaller than concentration of the first-conductivity-type impurity in the second semiconductor layer.

2. The power semiconductor device according to claim 1, wherein
   the first semiconductor substrate, the second semiconductor layer, the third semiconductor pillar region and the fourth semiconductor pillar region are made of silicon,
   the first conductivity type is n type, and
   the second conductivity type is p type.

3. The power semiconductor device according to claim 1, further comprising:
   fifth semiconductor layers of the second conductivity type provided on the fourth semiconductor pillar regions and connected to the fourth semiconductor pillar regions;
   a sixth semiconductor layer of the first conductivity type formed on an upper surface of the fifth semiconductor layer and connected to the second main electrode;
   a gate electrode provided on the third semiconductor pillar region and the sixth semiconductor layer; and
   a gate insulating film disposed between the gate electrode, and the third semiconductor pillar region and the sixth semiconductor layer,
   an upper end portion of the third semiconductor pillar region lying between the fifth semiconductor layers, and
   the gate electrode being provided in a region including an immediately upper region of a portion of the fifth semiconductor layer that lies between the sixth semiconductor layer and the third semiconductor pillar region.

4. A power semiconductor device, comprising:
   a first semiconductor substrate of a first conductivity type;
   a second semiconductor layer of the first conductivity provided on the first semiconductor substrate;
   a plurality of third semiconductor pillar regions of the first conductivity type and a plurality of fourth semiconductor pillar regions of a second conductivity type that are provided in an upper layer of the second semiconductor layer and alternatively arranged along a direction parallel to an upper surface of the first semiconductor substrate;

a first main electrode provided on a lower surface of the first semiconductor substrate and connected to the first semiconductor substrate; and a second main electrode provided on the fourth semiconductor pillar regions, a concentration of first-conductivity-type impurity in a connective portion between the second semiconductor layer and the third semiconductor pillar regions being lower than concentrations of first-conductivity-type impurity in portions of both sides of the connective portion in a direction from the second semiconductor layer to the third semiconductor pillar regions, a position of the connective portion in a direction perpendicular to an upper surface of the first semiconductor substrate corresponding to a position of a border portion between the second semiconductor layer and the fourth semiconductor pillar regions in the perpendicular direction, the third semiconductor pillar region and the fourth semiconductor pillar region being formed by forming a buffer layer and an intermediate semiconductor layer, both of the buffer layer and the intermediate semiconductor layer having lower concentrations of the first-conductivity-type impurity than the concentration of the first-conductivity-type of the second semiconductor layer, and by diffusing the first-conductivity-type impurity and the second-conductivity-type impurity into both of the buffer layer and the intermediate semiconductor layer respectively, a concentration profile of the first-conductivity-type impurity measured along a straight line passing through the first semiconductor substrate, the second semiconductor layer, and the third semiconductor pillar region in this order having a local minimum value in a position corresponding to the connective portion between the second semiconductor layer and the third semiconductor pillar regions, the local minimum value being greater than the concentration of the first-conductivity-type impurity in the buffer layer and smaller than concentration of the first-conductivity-type impurity in the second semiconductor layer.

5. The power semiconductor device according to claim 4, wherein the local minimum value is the minimum value in the concentration profile.

6. The power semiconductor device according to claim 4, wherein first semiconductor substrate, the second semiconductor layer, the third semiconductor pillar region and the fourth semiconductor pillar region are made of silicon, the first conductivity type is n type, and the second conductivity type is p type.

7. The power semiconductor device according to claim 4, further comprising:

fifth semiconductor layers of the second conductivity type provided on the fourth semiconductor pillar regions and connected to the fourth semiconductor pillar regions;

a sixth semiconductor layer of the first conductivity type formed on an upper surface of the fifth semiconductor layer and connected to the second main electrode;

a gate electrode provided on the third semiconductor pillar region and the sixth semiconductor layer; and a gate insulating film disposed between the gate electrode, and the third semiconductor pillar region and the sixth semiconductor layer, an upper end portion of the third semiconductor pillar region lying between the fifth semiconductor layers, and the gate electrode being provided in a region including an immediately upper region of a portion of the fifth semiconductor layer that lies between the sixth semiconductor layer and the third semiconductor pillar region.

* * * * *